(12) United States Patent
Jamneala et al.

(10) Patent No.: US 7,548,140 B2
(45) Date of Patent: Jun. 16, 2009

(54) BULK ACOUSTIC WAVE (BAW) FILTER HAVING REDUCED SECOND HARMONIC GENERATION AND METHOD OF REDUCING SECOND HARMONIC GENERATION IN A BAW FILTER

(75) Inventors: Tiberiu Jamneala, San Francisco, CA (US); Paul D. Bradley, Los Altos, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 246 days.

(21) Appl. No.: 11/735,768

(22) Filed: Apr. 16, 2007

(65) Prior Publication Data

US 2008/0252398 A1    Oct. 16, 2008

(51) Int. Cl.
*H03H 9/54* (2006.01)
*H03H 3/02* (2006.01)

(52) U.S. Cl. ...................... 333/189; 310/357
(58) Field of Classification Search .................. 333/189, 333/187, 133; 310/357
See application file for complete search history.

(56) References Cited

U.S. PATENT DOCUMENTS

| | | | | |
|---|---|---|---|---|
| 5,294,862 A | * | 3/1994 | Banno et al. | 310/366 |
| 5,351,021 A | * | 9/1994 | Masaie et al. | 333/189 |
| 7,365,619 B2 | * | 4/2008 | Aigner et al. | 333/189 |
| 2006/0290446 A1 | | 12/2006 | Aigner et al. | |
| 2008/0007369 A1 | | 1/2008 | Barber | |
| 2008/0055020 A1 | * | 3/2008 | Handtmann et al. | 333/189 |
| 2008/0297278 A1 | * | 12/2008 | Handtmann et al. | 333/189 |

FOREIGN PATENT DOCUMENTS

| | | | | |
|---|---|---|---|---|
| DE | 10 2006 032 950 A1 | * | 1/2008 | |
| JP | 02-302114 | * | 12/1990 | 333/190 |
| WO | WO-2008/009274 | | 1/2008 | |

* cited by examiner

*Primary Examiner*—Barbara Summons

(57) ABSTRACT

In a filter having a half-ladder structure comprising an alternating series of series branches and shunt branches, including a signal input and a signal output related to a common ground, at least one series branch or one parallel branch of the filter is configured as a BAW device comprising a first BAW resonator and a second BAW resonator connected either antiparallel or antiseries. The second harmonic emission generated by the first BAW resonator substantially cancels the second harmonic emission of the second BAW resonator and the second harmonic emission of at least one other series branch or one other parallel branch of the filter. By this method, the filter's second harmonic emissions are reduced.

20 Claims, 5 Drawing Sheets

BULK ACOUSTIC WAVE (BAW) FILTER HAVING REDUCED SECOND HARMONIC GENERATION AND METHOD OF REDUCING SECOND HARMONIC GENERATION IN A BAW FILTER

BACKGROUND

There is an increasing demand for communication devices capable of operating across a variety of different frequency bands. In particular, there is an increasing demand for cellular or mobile telephones that can operate in multiple frequency bands. In such devices, separate transmit and receive filters are in general employed for each transmit and receive frequency band. In practice, bulk acoustic wave (BAW) filters are often employed.

The simplest implementation of a BAW resonator comprises a layer of piezoelectric material arranged between two metal electrodes. Common piezoelectric materials are, for example, aluminum nitride (AlN) or zinc oxide (ZnO).

FIG. 1 shows an exemplary BAW resonator 10 having a static capacitance C which comprises a layer of piezoelectric material which will be referred to as piezo layer 12 below and is located between a first electrode, or top electrode T, and a second electrode, or bottom electrode B. The designations top electrode and bottom electrode merely serve definition purposes and do not represent any limitation with regard to the spatial arrangement and positioning of the BAW resonator. Rather, the designations top electrode and bottom electrode serve to define the positions of these electrodes in relation to a polarization of the piezoelectric material, as will be explained below, so that the polarization of the respective BAW resonators can be derived from an equivalent circuit diagram designating the T and B electrodes.

If an electric field is applied between first electrode T and second electrode B of BAW resonator 10, the reciprocal or inverse piezoelectric effect will cause BAW resonator 10 to mechanically expand or contract, the case of expansion or of contraction depending on the polarization of the piezoelectric material, as has been mentioned above. This means that the opposite case applies if the electric field is inversely applied between the T and B electrodes. In the case of an alternating field, an acoustic wave is generated in piezo layer 12, and, depending on the implementation of the BAW resonator, this wave will propagate, for example, in parallel with the electric field, as a longitudinal wave, or, as a transversal wave, transverse to the electric field, and will be reflected, for example, at the interface of piezo layer 12. Whenever the thickness d of piezo layer 12 and of the top and bottom electrodes equals an integer multiple of half the wavelength $\lambda$ of the acoustic waves, resonance states and/or acoustic resonance vibrations will occur. The fundamental resonance frequency, i.e. the lowest resonance frequency $F_{RES}$, will then be inversely proportional to total thickness of the resonator. This means that the BAW resonator vibrates at the frequency specified externally.

The piezoelectric properties and, thus, also the resonance properties of a BAW resonator depend on various factors, e.g. on the piezoelectric material, the production method, the polarization impressed upon the BAW resonator during manufacturing, and the size of the crystals. As has been mentioned above, it is particularly the resonance frequency which depends on total thickness of the resonator.

As has been mentioned above, BAW resonators exhibit electric polarization. The direction of mechanical deformation, extraction or contraction, of the BAW resonator depends on the direction of the electric field applied to first electrode T and second electrode B and on the direction of polarization of BAW resonator 10. For example, if the polarization of the BAW resonator and the direction of the electric field are pointing in the same direction, BAW resonator 10 contracts, whereas BAW resonator 10 expands when the polarization of BAW resonator 10 and the direction of the electric field are pointing in the opposite direction.

BAW resonators can have a variety of configurations. Typically, one differentiates between so-called FBARs (thin film bulk acoustic resonators) and SMRs (solidly mounted resonators). In addition, a BAW resonator may have one piezo layer 12, or it may have several piezo layers 12.

BAW resonators are often employed in filters.

FIG. 2 shows a circuit diagram of a filter 20, comprising a first series BAW resonator 48, a second series BAW resonator 55, a third series BAW resonator 52, a fourth series BAW resonator 53, a first shunt BAW resonator 54, a second shunt BAW resonator 56, a third shunt BAW resonator 58 and a fourth shunt BAW resonator 65. The series BAW resonators 48, 55, 52, 53 are connected in series between input port 44 and output port 46. First shunt BAW resonator 54 is connected in parallel between input port 44 and electrical ground 42. Second shunt BAW resonator 56 is connected between a connection node between first series BAW resonator 48 and second series BAW resonator 55, and electrical ground 42. Third shunt BAW resonator 58 is connected between a connection node between second series BAW resonator 55 and third series BAW resonator 52, and electrical ground 42. Fourth shunt BAW resonator 65 is between a connection node between third series BAW resonator 52 fourth series BAW resonator 53, and electrical ground 42. Each of the series and shunt BAW resonators comprises a top electrode T and a bottom electrode B, which are indicated in the equivalent circuit diagram of FIG. 2 so as to indicate the polarization of each of the BAW resonators.

One problem with filter circuits employing one or more BAW resonators, such as filter 20, is non-linear behavior of one or more of the BAW resonators. This problem occurs particularly when a BAW resonator is driven with higher power levels, and can result in the undesirable generation of harmonic content in the output signal.

One approach to mitigating this issue is to "cascade" the affected BAW resonators. In the following, a "cascade" means a chain, or series connection of elements. That is, a BAW resonator exhibiting static capacitance C is replaced by a cascade of two BAW resonators, each exhibiting a static capacitance 2C, so that the total capacitance of the series combination is again C. In principle, such a cascaded pair of BAW resonators has the same impedance properties as a corresponding individual BAW resonator. A cascaded pair of BAW resonators exhibiting static capacitance 2C is larger, by a factor of 4, than a corresponding individual BAW resonator exhibiting static capacitance C. As a result of the above-mentioned cascading, the energy density is also smaller by a factor of 4, and, thus, non-linear effects are reduced by 6 dB with a cascaded BAW resonator.

However, the aforementioned cascading arrangement has some drawbacks. A major disadvantage of replacing a BAW resonator by an equivalent cascaded pair of BAW resonators is the increase in size by a factor of 4, as noted above. Accordingly, such cascading considerably increases the size of the filter if it is carried out for all BAW resonators of a filter. As a result, it is generally impractical to utilize cascading for all resonator branches of a filter.

What is needed, therefore, is a general matching network and method of matching an antenna or other device to a plurality of BAW, SAW, and/or FBAR filters than can alleviate one or more of these shortcomings.

SUMMARY

In an example embodiment, a filter having a half-ladder structure comprising an alternating series of series branches and shunt branches, includes a signal input and a signal output related to a common ground, wherein at least one series branch or one parallel branch of the filter is configured as a BAW device comprising a first BAW resonator and a second BAW resonator connected either antiparallel or antiseries A second harmonic emission generated by the first BAW resonator substantially cancels a second harmonic emission of the second BAW resonator and a second harmonic emission of at least one other series branch or one other parallel branch of the filter.

In another example embodiment, a method is provided for reducing a harmonic emission within a BAW filter having a half-ladder structure comprising an alternating series of series branches and shunt branches, including a signal input and a signal output related to a common ground. The method comprising configuring at least one series branch or one parallel branch of the filter as a BAW device comprising a first BAW resonator and a second BAW resonator connected either antiparallel or antiseries, and configuring the first BAW resonator and the second BAW resonator such that a second harmonic emission generated by the first BAW resonator substantially cancels a second harmonic emission of the second BAW resonator and a second harmonic emission of at least one other series branch or one other parallel branch of the filter.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

Figure 3:
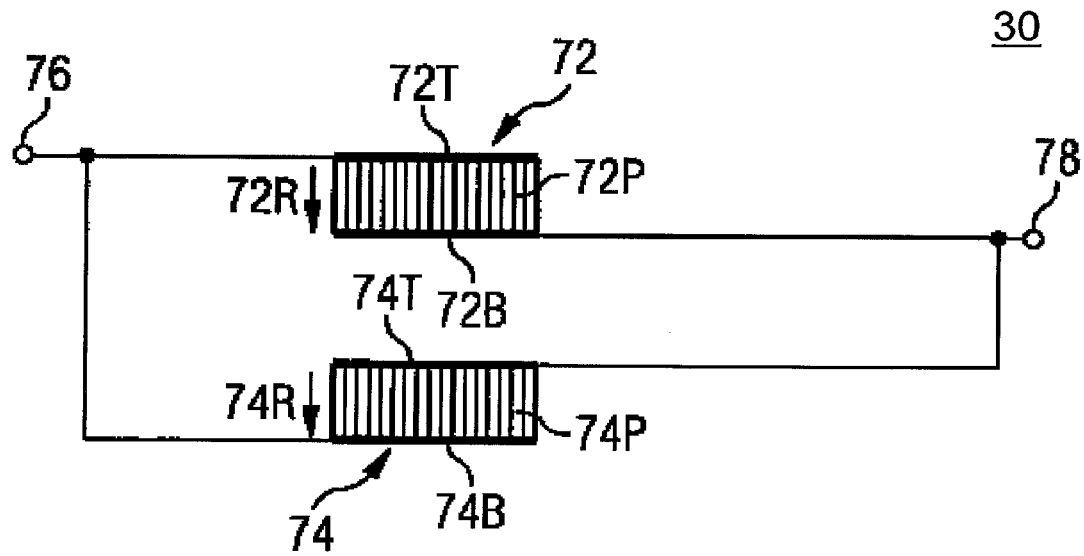
FIG. 3 shows a BAW device comprising two BAW resonators connected antiparallel.

FIG. 3 shows a BAW device 30 comprising a first BAW resonator 72 and a second BAW resonator 74, connected antiparallel. First BAW resonator 72 comprises a piezo layer 72P, a first electrode 72T, and a second electrode 72B, and second BAW resonator 74 comprises a piezo layer 74P, a first electrode 74T, and a second electrode 74B. First BAW resonator 72 is polarized, from first electrode 72T, in the direction of second electrode 72B, and second BAW resonator 74 is also polarized from first electrode 74T in the direction of second electrode 74B, and first electrode 72T of the first BAW resonator 72 is electrically connected to second electrode 74B of second BAW resonator 74, and to a first electrical terminal 76 of BAW device 30, whereas second electrode 72B of first BAW resonator 72 is electrically connected to first electrode 74T of second BAW resonator 74, and to second electrical terminal 78 of BAW apparatus 30. Arrow 72R points to an exemplary direction of a polarization of first BAW resonator 72, and arrow 74R points to an exemplary direction of a polarization of second BAW resonator 74. The only thing that is essential for BAW device 30 and/or antiparallel connection of BAW resonators 72, 74 is that the polarizations 72R, 74R of two BAW resonators 72, 74 have the same direction with regard to the first electrode 72T, 74T and the second electrode 72B, 74B. Alternatively, for example, the polarization of both BAW resonators 72, 74 may also be pointing in the direction from second electrode 72B, 74B to first electrode 72T, 74T.

Thus, BAW device 30 consists of BAW resonator pair 72 and 74 connected antiparallel.

As has been described above in the prior art, there are many varied implementations of BAW resonators, including FBAR resonators and SMRs, each of which implementations may be applied to the BAW device 30 of FIG. 3. Also, for example, BAW resonators 72, 74 alternatively may also comprise several piezo layers, even if FIG. 3 only shows one piezo layer 72P, 74P. In addition, BAW device 30 may be created by interconnecting two separate and/or individual BAW resonators 72, 74, but alternatively, for example, also by interconnecting two BAW resonators 72, 74 sharing a common piezo layer.

If first BAW resonator 72 and second BAW resonator 74 have the same capacitance, e.g. C/2, then BAW device 30 overall acts like a regular or "common" BAW resonator exhibiting capacitance C. However, BAW device 30 will exhibit considerably reduced non-linear properties (e.g., harmonic emissions) compared with a corresponding common BAW resonator exhibiting capacitance C. In particular, the second harmonic emission of BAW device 30 is reduced substantially compared to a second harmonic emission of a common BAW resonator having the same capacitance. For example only, in one particular embodiment, the second harmonic emission of BAW device 30 is reduced by about 30 dB compared to a corresponding common BAW resonator exhibiting capacitance C.

Figure 4:
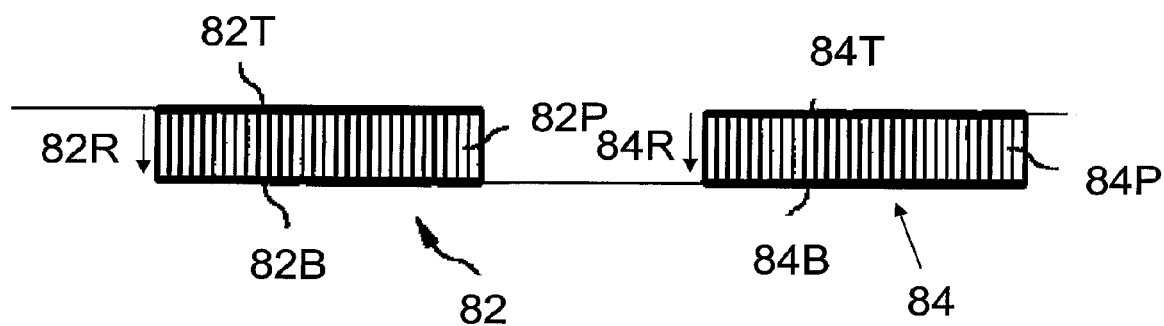
FIG. 4 shows a BAW device comprising two BAW resonators connected antiseries.

FIG. 4 shows a BAW device 40 comprising a first BAW resonator 82 and a second BAW resonator 84, connected antiseries. First BAW resonator 82 comprises a piezo layer 82P, a first electrode 82T, and a second electrode 82B, and second BAW resonator 84 comprises a piezo layer 84P, a first electrode 84T, and a second electrode 84B. First BAW resonator 82 is polarized, from first electrode 82T, in the direction of second electrode 82B, and second BAW resonator 84 is also polarized from first electrode 84T in the direction of second electrode 84B. First electrode 82T of the first BAW resonator 82 is electrically connected to a first electrical terminal 86 of BAW device 40. Second electrode 82B of the first BAW resonator 82 is electrically connected to second electrode 84B of second BAW resonator 84. First electrode 84T of second BAW resonator 84 is electrically connected to second electrical terminal 88 of BAW apparatus 40. Arrow 82R points to an exemplary direction of a polarization of first BAW resonator 82, and arrow 84R points to an exemplary direction of a polarization of second BAW resonator 84.

Thus, BAW device 40 consists of BAW resonator pair 82 and 84 connected antiseries.

As has been described above in the prior art, there are many varied implementations of BAW resonators, including FBAR resonators and SMRs, each of which implementations may be applied to the BAW device 40 of FIG. 4. Also, for example, BAW resonators 82, 84 alternatively may also comprise several piezo layers, even if FIG. 4 only shows one piezo layer 82P, 84P. In addition, BAW device 40 may be created by interconnecting two separate and/or individual BAW resonators 82, 84.

If first BAW resonator 82 and second BAW resonator 84 have the same capacitance, e.g. 2C, then BAW device 40 overall acts like a regular or "common" BAW resonator exhibiting capacitance C. However, BAW device 40 will exhibit considerably reduced non-linear properties (e.g., harmonic emissions) compared with a corresponding common BAW resonator exhibiting capacitance C. That is, a second harmonic emission of BAW device 40 is reduced substantially compared to a second harmonic emission of a common BAW resonator having the same capacitance. For example only, in one particular embodiment, the second harmonic emission of BAW device 40 is reduced by about 30 dB compared to a corresponding common BAW resonator exhibiting capacitance C.

Antiparallel BAW device 30 and antiseries BAW device 40 may be employed in one or more series or shunt branches of a filter having a half-ladder structure to improve the non-linear performance of the filter, particularly to reduce a second harmonic emission of the overall filter.

Figure 5:
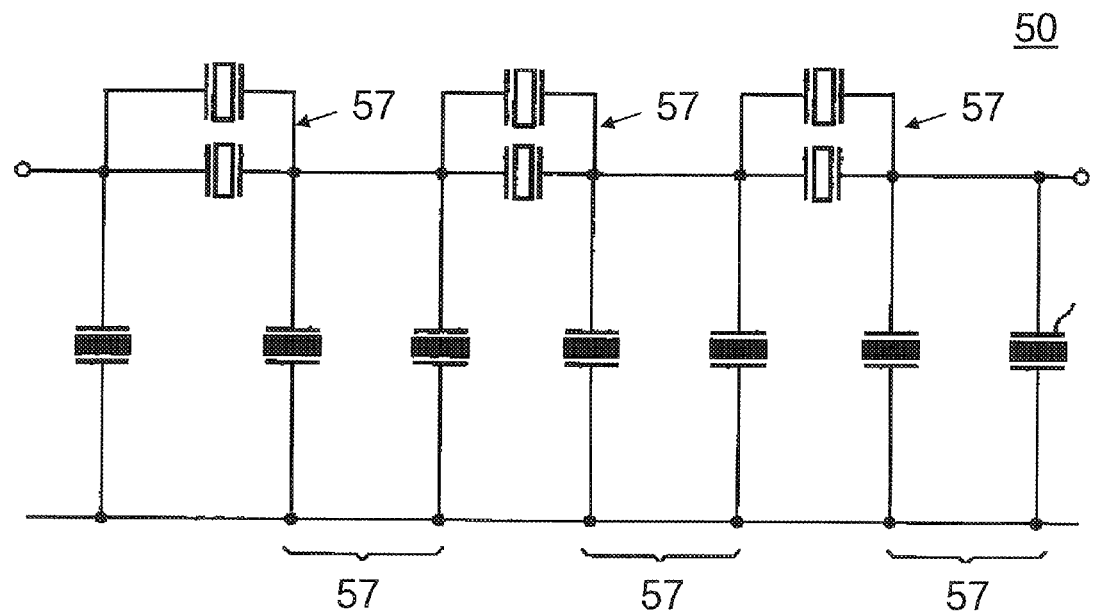
FIG. 5 shows one embodiment of a filter having a half-ladder structure comprising an alternating series of series branches and shunt branches, where all series branches and all parallel branches of the filter are configured as a BAW device comprising a first BAW resonator and a second BAW resonator connected antiseries or antiparallel.

FIG. 5 shows one embodiment of a filter 50 having a half-ladder structure comprising an alternating series of series branches and shunt branches, where each of the series and shunt branches is configured as a BAW device 57 comprising a first BAW resonator and a second BAW resonator connected antiparallel, as shown in FIG. 3.

Figure 6:
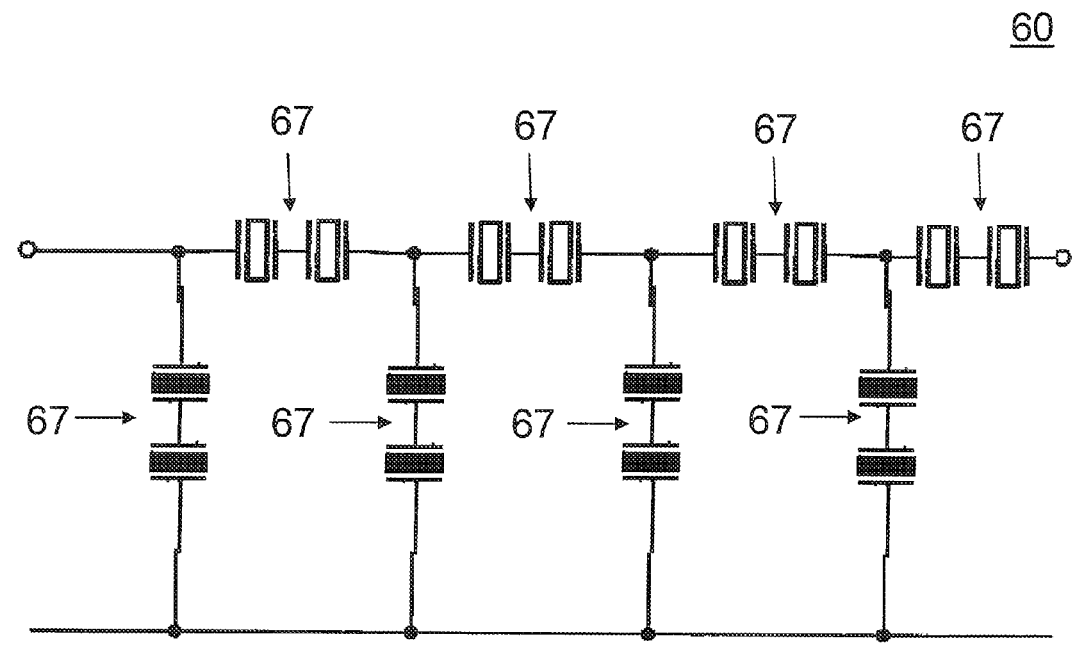
FIG. 6 shows another embodiment of a filter having a half-ladder structure comprising an alternating series of series branches and shunt branches, where at least one series branch or one parallel branch of the filter is configured as a BAW device comprising a first BAW resonator and a second BAW resonator connected antiseries or antiparallel.

FIG. 6 shows another embodiment of a filter 60 having a half-ladder structure comprising an alternating series of series branches and shunt branches, where each of the series and shunt branches is configured as a BAW device 67 comprising a first BAW resonator and a second BAW resonator connected antiseries, as shown in FIG. 4.

Figure 1:
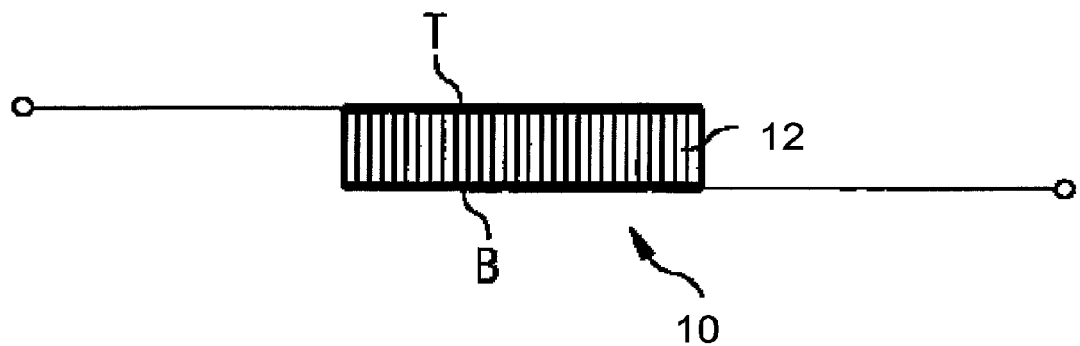
FIG. 1 shows an exemplary BAW resonator.
Figure 2:
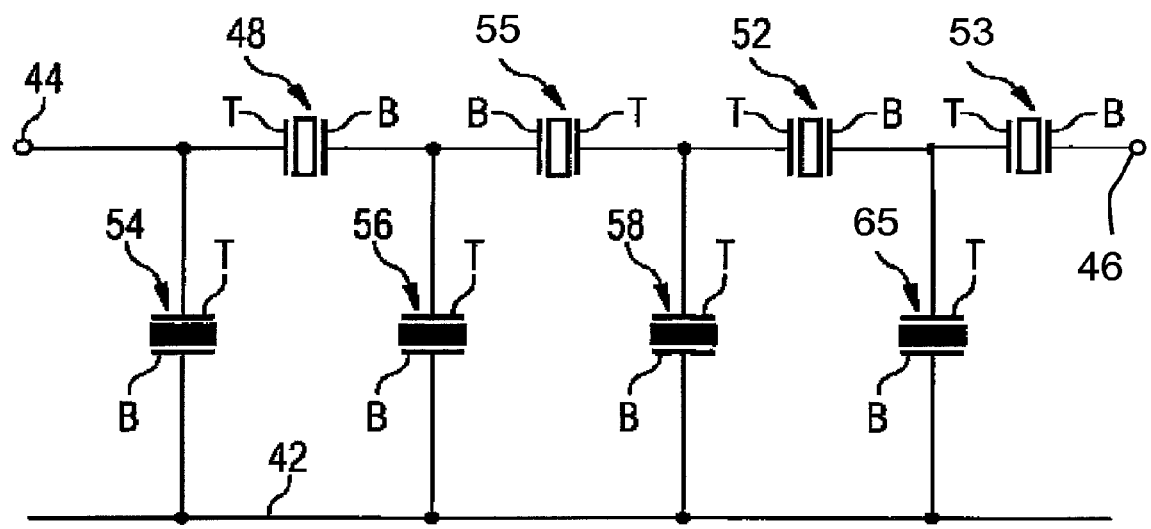
FIG. 2 shows a circuit diagram of a filter having a half-ladder structure comprising an alternating series of series branches and shunt branches each including a BAW resonator.

As noted above, the filters 50 and 60 can exhibit substantially improved non-linear performance compared to a filter 20 of FIG. 2 having the same capacitance values in each series and shunt branch. In particular, the second harmonic emission performance of filter 50 or filter 60 may be several tens of decibels better than the performance of a filter 20 of FIG. 2 having the same capacitance values in each series and shunt branch.

However, there are drawbacks to filters 50 and 60.

In filter 50, each BAW device 57 comprising a first BAW resonator having value C/2 and a second BAW resonator having value C/2 connected antiparallel exhibits a substantially reduced quality factor (i.e., "Q") compared to an equivalent common BAW resonator having the same capacitance value C. As a result, filter 50 has a greatly diminished quality factor, meaning it is lossier and less efficient than the equivalent filter 20. In many applications, this reduced quality factor is not acceptable.

Meanwhile, in filter 60, each BAW device 67 comprising a first BAW resonator having value 2C and a second BAW resonator having value 2C connected antiseries exhibits a substantially increased size (4×) compared to an equivalent common BAW resonator having the same capacitance value C. As a result, filter 60 requires a greatly increased size than the equivalent filter 20. In many applications, this increased size is not acceptable.

Accordingly, other solutions to reducing harmonic emissions are sought.

Figure 7:
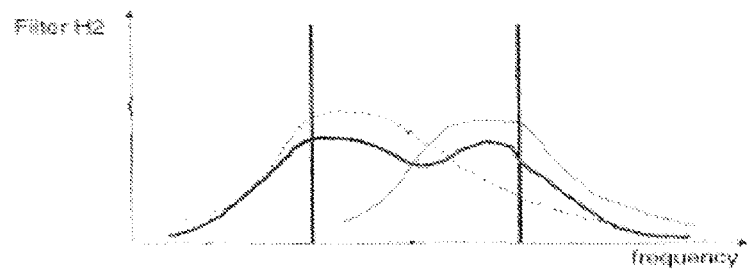
FIG. 7 shows a plot of the second harmonic emission of the filter of FIG. 2 at its output port as a function of frequency.

FIG. 7 shows a plot of the second harmonic emission of filter 20 of FIG. 2 at output port 46 as a function of frequency. It can be seen that the plot has two "peaks"—a "negative phase" peak at a lower frequency that is dominated by the second harmonic emission of shunt branches of filter 20, and a "positive phase" peak at a higher frequency that is dominated by the second harmonic emission of series branches of filter 20.

It can be shown that at output port 46, the main sources second harmonic emissions are from the fourth series branch including BAW resonator 53 and the fourth shunt branch including BAW resonator 65—i.e., the "last" series and shunt branches nearest output port 46. Indeed, for example, at output port 46 the contribution of second harmonic emissions from third series BAW resonator 52 and third shunt BAW resonator 58 are about 10 dB less than the contribution of second harmonic emissions from fourth series BAW resonator 53 and fourth shunt BAW resonator 65. The contributions of first and second series BAW resonators 48 and 55, and first and second shunt BAW resonators 54 and 56 is even less.

Figure 8:
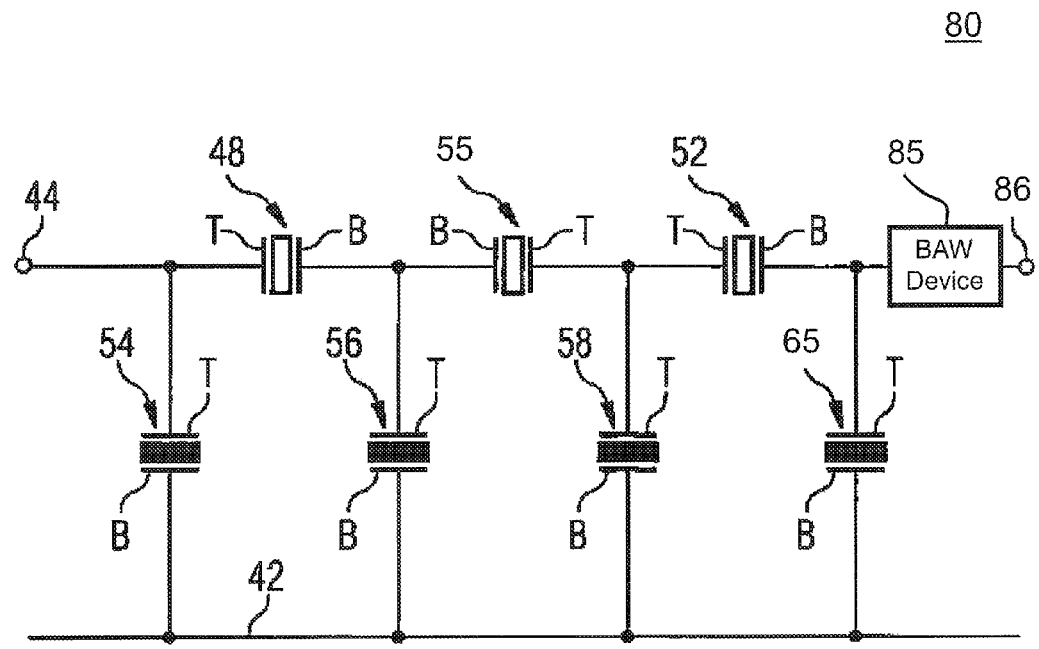
FIG. 8 shows another embodiment of a filter 90 having a half-ladder structure comprising an alternating series of series branches and shunt branches, where only the "last" series branch nearest the output port is configured as a BAW device comprising a first BAW resonator and a second BAW resonator connected antiseries or antiparallel.

Accordingly, FIG. 8 shows another embodiment of a filter 80 having a half-ladder structure comprising an alternating series of series branches and shunt branches, where only the "last" series branch nearest the output port 86 is configured as a BAW device 85 comprising a first BAW resonator and a second BAW resonator connected either antiparallel, as shown in FIG. 3, or antiseries, as shown in FIG. 4.

As explained above, in the case of the antiparallel configuration, if first BAW resonator and second BAW resonator have the same capacitance, e.g. C/2, then BAW device 85 overall acts like a regular or "common" BAW resonator exhibiting capacitance C, except the harmonic emission is substantially reduced—in particular, the second harmonic emission level of BAW device 85 is 30 dB less that of an equivalent common BAW resonator. Similarly, in the case of the antiseries configuration, if first BAW resonator and second BAW resonator have the same capacitance, e.g. 2C, then BAW device 85 overall acts like a regular or "common" BAW resonator exhibiting capacitance C, except the harmonic emission is substantially reduced—again, in particular, the second harmonic emission of BAW device 85 is 30 dB less than the equivalent common BAW resonator.

In comparison to filters 50 and 60, because filter 80 only replaces a single common BAW resonator with a BAW device 85 comprising a first BAW resonator and a second BAW resonator connected either antiparallel or antiseries, then the size is only increased slightly or its quality factor is only diminished slightly—in contrast to filters 50 and 60.

Figure 9:
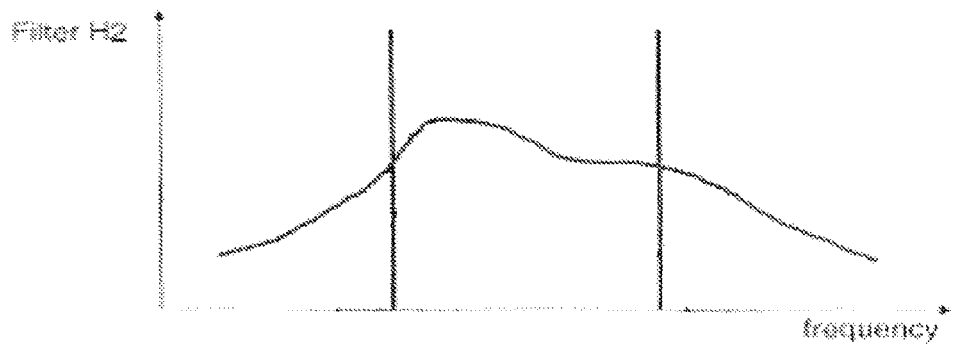
FIG. 9 shows a plot of the second harmonic emission of the filter of FIG. 8 at its output port as a function of frequency.

FIG. 9 shows a plot of the second harmonic emission of filter 80 at output port 86 as a function of frequency. Compared to FIG. 7, it can be seen that the "negative phase" peak at a lower frequency that is dominated by the second harmonic emissions of shunt branches of filter 80 remains, and in fact, worsens at lower frequencies. This could be addressed by replacing the "last" shunt resonator of filter 80, nearest output port 86, with a BAW device comprising a first BAW resonator and a second BAW resonator connected either antiparallel, as shown in FIG. 3, or antiseries, as shown in FIG. 4. However, it is also seen that the "positive phase" peak at a higher frequency that is dominated by the second harmonic emission of series branches of filter 80 is only reduced about 10 dB compared to filter 20, even though the second harmonic emission of BAW device 85 is 30 dB less than the equivalent common BAW resonator.

Figure 10:
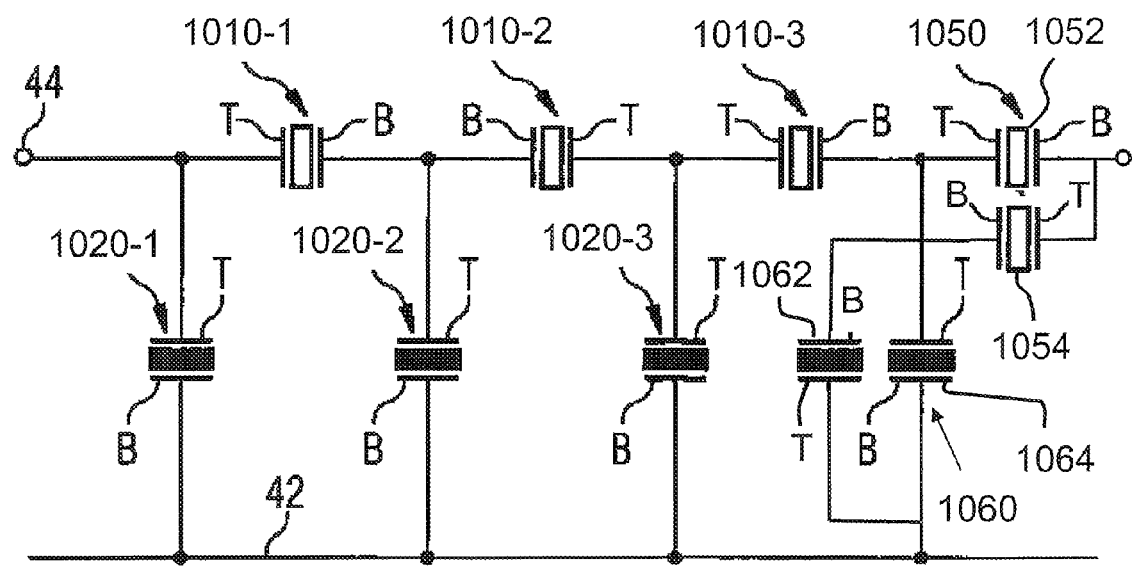
FIG. 10 shows one embodiment of a filter which exhibits reduced harmonic emissions.

Accordingly, FIG. 10 shows one embodiment of a filter 1000 which exhibits reduced harmonic emissions. Filter 1000 has a half-ladder structure comprising an alternating series of series branches 1010-$i$ and shunt branches 1020-$i$, where each of the series and shunt branches 1010$i$/1020$i$ includes a corresponding BAW resonator having the shown polarity, except for a "last" series branch and a last shunt branch. The last series branch nearest output port 46 includes BAW device 1050, and the last shunt branch nearest output port 46 includes a BAW device 1060. In the embodiment of FIG. 10, BAW device 1050 includes a first BAW resonator 1052 and a second BAW resonator 1054 connected antiparallel. Meanwhile, BAW device 1060 includes a first BAW resonator 1062 and a second BAW resonator 1064 connected antiparallel.

Beneficially, BAW device 1050 is configured such that BAW resonator 1052 and second BAW resonator 1054 do not have the same capacitance (e.g., C/2) as each other and are not equivalent to each other. In one particular exemplary implementation, BAW resonator 1052 and BAW resonator 1054 are selected so that: (1) the parallel combination produces the desired capacitance C; and (2) the 2nd harmonic emission of BAW resonator 1052 substantially equals the 2nd harmonic emission of BAW resonator 1054 plus the 2nd harmonic emission of series BAW resonator 1010-3, but in opposite phase. In that case, since BAW resonator 1052 has an opposite polarity than that of BAW resonator 1054 and series BAW resonator 1010-3, the 2nd harmonic emission of BAW resonator 1052 substantially cancels the 2nd harmonic emission of BAW resonator 1054 plus the 2nd harmonic emission of series BAW resonator 1010-3. In this context, substantial cancellation means that the resultant 2nd harmonic emission is about 10 dB less than the 2nd harmonic emission that would have been produced by the combination of BAW resonator 1052, BAW resonator 1054, and series BAW resonator 1010-3 if BAW resonator 1052 and BAW resonator 1054 had the same capacitance (e.g., C/2) as each other, such as in filter 80.

If one plots the second harmonic emission of filter 1000 versus frequency, one would observe that the "positive phase" peak at a higher frequency, which is dominated by the second harmonic emission of series branches of filter 1000, is reduced about 20 dB compared to filter 20.

In similar fashion to that explained above, beneficially first BAW resonator 1062 and second BAW resonator 1064 are selected so that: (1) the parallel combination produces the desired capacitance C; and (2) the $2^{nd}$ harmonic emission of BAW resonator 1062 substantially cancels the $2^{nd}$ harmonic emission of BAW resonator 1064 plus the $2^{nd}$ harmonic emission of shunt BAW resonator 1020-3.

Furthermore, in another particular exemplary implementation, BAW resonator 1052 and BAW resonator 1054 are selected so that: (1) the parallel combination produces the desired capacitance C; and (2) the 2nd harmonic emission of BAW resonator 1052 plus the 2nd harmonic emission of series BAW resonator 1010-2 substantially equals the 2nd harmonic emission of BAW resonator 1054 plus the 2nd harmonic emission of series BAW resonator 1010-3, but in opposite phase. In that case, since BAW resonators 1052 and series BAW resonator 1010-3 have an opposite polarity than that of BAW resonator 1054 and series BAW resonator 1010-2, the 2nd harmonic emission of BAW resonator 1052 substantially cancels the 2nd harmonic emission of BAW resonator 1054 plus the 2nd harmonic emission of series BAW resonator 1010-3 and the 2nd harmonic emission of series BAW resonator 1010-2. In this context, substantial cancellation means that the resultant 2nd harmonic emission is about 10 dB less than the harmonic emission that would have been produced by the combination of BAW resonator 1052, BAW resonator 1054, and series BAW resonators 1010-2 and 1010-3 if BAW resonator 1052 and BAW resonator 1054 had the same capacitance (e.g., C/2) as each other, such as in filter 80.

If one plots the second harmonic emission of filter 1000 versus frequency, one would observe that the "positive phase" peak at a higher frequency, which is dominated by the second harmonic emission of series branches of filter 1000, is reduced more than 20 dB compared to filter 20.

Conceptually, in general it is possible to select BAW resonator 1052 and BAW resonator 1054 so that: (1) the parallel combination produces the desired capacitance C; and (2) the 2nd harmonic emission of BAW resonator 1052 substantially cancels the 2nd harmonic emission of BAW resonator 1054 plus the 2nd harmonic emissions of all series BAW resonators 1010-$i$ in filter 1000.

In similar fashion to that explained above, in general it is possible to select BAW resonator 1062 and second BAW resonator 1064 so that: (1) the parallel combination produces the desired capacitance C; and (2) the 2nd harmonic emission of BAW resonator 1062 substantially cancels the 2nd harmonic emission of BAW resonator 1064 plus the 2nd harmonic emissions of all shunt BAW resonators 1020-$i$ in filter 1000.

Various combinations are possible, including the use of only BAW device 1050 or BAW device 1060 in place of a common BAW resonator of equivalent capacitance.

Furthermore, although FIG. 10 shows an embodiment where BAW devices 1050 and 1060 each comprise and antiparallel combination of BAW resonators, one or both BAW devices may instead comprise an antiseries combination of BAW resonators, where: (1) the series combination produces the desired capacitance C; and (2) the $2^{nd}$ harmonic emission of a first BAW resonator substantially cancels the $2^{nd}$ harmonic emission of a second BAW resonator plus the $2^{nd}$

The invention claimed is:

1. A filter having a half-ladder structure comprising an alternating series of series branches and shunt branches, including a signal input and a signal output related to a common ground, wherein at least one series branch or one parallel branch of the filter is configured as a BAW device comprising a first BAW resonator and a second BAW resonator connected either antiparallel or antiseries, wherein a second harmonic emission generated by the first BAW resonator substantially cancels a second harmonic emission of the second BAW resonator and a second harmonic emission of at least one other series branch or one other parallel branch of the filter.

2. The filter of claim 1, wherein a first electrode of the first BAW resonator is electrically connected to a second electrode of the second BAW resonator and to a first electrical terminal of the BAW device, and a second electrode of the first BAW resonator is electrically connected to a first electrode of the second BAW resonator and to a second electrical terminal of the BAW device, and wherein, the first and second BAW resonators have the same polarizations with regard to their first electrodes and their second electrodes.

3. The filter of claim 1, wherein a resonance frequency of the first BAW resonator and a resonance frequency of the second BAW resonator are substantially identical.

4. The filter of claim 1, wherein a capacitance of the first BAW resonator is greater than a capacitance of the second BAW resonator.

5. The filter of claim 1, wherein a series branch is configured as the BAW device, and wherein the second harmonic emission generated by the first BAW resonator substantially cancels the second harmonic emission of the second BAW resonator and a second harmonic emission of at least one other series branch of the filter.

6. The filter of claim 5, wherein the second harmonic emission generated by the first BAW resonator substantially cancels the second harmonic emission of the second BAW resonator and second harmonic emissions of all other series branches of the filter.

7. The filter of claim 5, wherein the BAW device is configured in a first series branch directly connected to the signal input.

8. The filter of claim 5, wherein the first and second BAW resonators of the BAW device are connected antiseries.

9. The filter of claim 5, wherein the first and second BAW resonators of the BAW device are connected antiparallel.

10. The filter of claim 1, wherein a shunt branch is configured as the BAW device, and wherein the second harmonic emission generated by the first BAW resonator substantially cancels the second harmonic emission of the second BAW resonator and a second harmonic emission of at least one other shunt branch of the filter.

11. The filter of claim 10, wherein the second harmonic emission generated by the first BAW resonator substantially cancels the second harmonic emission of the second BAW resonator and second harmonic emissions of all other shunt branches of the filter.

12. The filter of claim 10, wherein the BAW device is configured in a first shunt branch directly connected to the signal input.

13. The filter of claim 10, wherein the first and second BAW resonators of the BAW device are connected antiseries.

14. The filter of claim 10, wherein the first and second BAW resonators of the BAW device are connected antiparallel.

15. A method of reducing a harmonic emissions within BAW filter having a half-ladder structure comprising an alternating series of series branches and shunt branches, including a signal input and a signal output related to a common ground, the method comprising configuring at least one series branch or one parallel branch of the filter as a BAW device comprising a first BAW resonator and a second BAW resonator connected either antiparallel or antiseries, and configuring the first BAW resonator and the second BAW resonator such that a second harmonic emission generated by the first BAW resonator substantially cancels a second harmonic emission of the second BAW resonator and a second harmonic emission of at least one other series branch or one other parallel branch of the filter.

16. The method of claim 15, further comprising electrically connecting a first electrode of the first BAW resonator to a second electrode of the second BAW resonator and to a first electrical terminal of the BAW device, and electrically connecting a second electrode of the first BAW resonator to a first electrode of the second BAW resonator and to a second electrical terminal of the BAW device, wherein, the first and second BAW resonators have the same polarizations with regard to their first electrode and their second electrode.

17. The method of claim 15, further comprising configuring a series branch as the BAW device, and wherein the second harmonic emission generated by the first BAW resonator substantially cancels the second harmonic emission of the second BAW resonator and a second harmonic emission of at least one other series branch of the filter.

18. The method of claim 17, wherein the second harmonic emission generated by the first BAW resonator substantially cancels the second harmonic emission of the second BAW resonator and second harmonic emissions of all other series branches of the filter.

19. The method of claim 15, further comprising configuring a shunt branch as the BAW device, and wherein the second harmonic emission generated by the first BAW resonator substantially cancels the second harmonic emission of the second BAW resonator and a second harmonic emission of at least one other shunt branch of the filter.

20. The method of claim 19, wherein the second harmonic emission generated by the first BAW resonator substantially cancels the second harmonic emission of the second BAW resonator and second harmonic emissions of all other shunt branches of the filter.

* * * * *